United States Patent
Jung

(10) Patent No.: US 8,841,677 B2
(45) Date of Patent: Sep. 23, 2014

(54) THIN FILM TRANSISTOR ARRAY PANEL AND MANUFACTURING METHOD THEREOF

(75) Inventor: Sun-Kyo Jung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 824 days.

(21) Appl. No.: 13/040,245

(22) Filed: Mar. 3, 2011

(65) Prior Publication Data

US 2012/0037909 A1 Feb. 16, 2012

(30) Foreign Application Priority Data

Aug. 12, 2010 (KR) ........................ 10-2010-0077979

(51) Int. Cl.
*H01L 27/14* (2006.01)
*H01L 27/12* (2006.01)

(52) U.S. Cl.
CPC ........ *H01L 27/1255* (2013.01); *H01L 27/1288* (2012.01)
USPC ................................. 257/72; 257/59; 257/60

(58) Field of Classification Search
USPC ....................................... 257/59–72, E29.273
See application file for complete search history.

(56) References Cited

U.S. PATENT DOCUMENTS

| 7,821,009 B2 * | 10/2010 | Park ................................ 257/72 |
| 8,013,325 B2 * | 9/2011 | Huh et al. ........................ 257/72 |
| 8,067,774 B2 * | 11/2011 | Choi et al. ....................... 257/72 |
| 2008/0100788 A1 | 5/2008 | Yang et al. |

FOREIGN PATENT DOCUMENTS

| KR | 10-2000-0050875 A | 8/2000 |
| KR | 10-2000-0067254 A | 11/2000 |
| KR | 10-2002-0002089 A | 1/2002 |
| KR | 10-2003-0020528 A | 3/2003 |
| KR | 10-2009-0110040 A | 10/2009 |

* cited by examiner

*Primary Examiner* — Cuong Q Nguyen
(74) *Attorney, Agent, or Firm* — Christie, Parker & Hale, LLP

(57) ABSTRACT

A thin film transistor array panel includes: a gate line and a storage electrode on a substrate and separated from each other; a gate insulating layer covering the gate line and the storage electrode; a data line crossing the gate line and being on the gate insulating layer; a thin film transistor formed at a crossing region of the gate line and the data line, and including a gate electrode, a source electrode, and a drain electrode; a passivation layer exposing a portion of the drain electrode and formed on the thin film transistor and the data line; and a pixel electrode contacting the drain electrode and overlapping the storage electrode with the gate insulating layer interposed therebetween.

12 Claims, 11 Drawing Sheets

THIN FILM TRANSISTOR ARRAY PANEL AND MANUFACTURING METHOD THEREOF

CROSS-REFERENCE TO RELATED APPLICATIONS

This application claims priority to and the benefit of Korean Patent Application No. 10-2010-0077979 filed in the Korean Intellectual Property Office on Aug. 12, 2010, the entire contents of which are incorporated herein by reference.

BACKGROUND

1. Field

The described technology relates generally to a thin film transistor array panel. More particularly, the described technology relates generally to a thin film transistor array panel and a manufacturing method thereof.

2. Description of the Related Art

A liquid crystal display (LCD) as one of flat panel displays includes a thin film transistor array panel formed with a plurality of pixel electrodes, a color filter panel formed with a common electrode, and a liquid crystal layer injected between the two panels. The liquid crystal display (LCD) applies a voltage to the pixel electrodes and the common electrode to change an arrangement of the liquid crystal molecules, and thereby light passes through the liquid crystal layer to display images.

Each pixel electrode and the common electrode form a liquid crystal capacitor such that the applied voltage is maintained after the thin film transistor is turned off. Also, a storage electrode overlapping the pixel electrode via a dielectric layer is formed in the thin film transistor array panel, and the storage electrode and the pixel electrode form a storage capacitor. The storage capacitor enhances the voltage storage capacity of the liquid crystal capacitor.

The capacitance of the storage capacitor may be increased to increase the luminance of the liquid crystal display (LCD) and the response speed. The capacitance of the storage capacitor is proportional to the size of the storage electrode, and is inversely proportional to the thickness of the dielectric layer. Accordingly, the area of the storage electrode is increased or the thickness of the dielectric layer is decreased to increase the capacitance of the storage capacitor.

However, if the size of the storage electrode is increased, the aperture ratio of the liquid crystal display (LCD) is decreased such that the high transmittance characteristic may not be realized, and if the thickness of the dielectric layer is small, the storage electrode and the pixel electrode may be shorted by foreign particles included in the dielectric layer such that the production yield may be deteriorated.

The above information disclosed in this Background section is only for enhancement of understanding of the background of the described technology and therefore it may contain information that does not form the prior art that is already known in this country to a person of ordinary skill in the art.

SUMMARY

Exemplary embodiments according to the present invention provide a thin film transistor array panel and a manufacturing method thereof for improving the aperture ratio by increasing the capacitance of the storage capacitor and reducing the size of the storage electrode while preventing a short of the storage electrode and the pixel electrode.

A thin film transistor array panel according to an exemplary embodiment includes: a gate line and a storage electrode on a substrate and separated from each other; a gate insulating layer covering the gate line and the storage electrode; a data line crossing the gate line and being on the gate insulating layer; a thin film transistor at a crossing region of the gate line and the data line, and including a gate electrode, a source electrode, and a drain electrode; a passivation layer exposing a portion of the drain electrode and formed on the thin film transistor and the data line; and a pixel electrode contacting the drain electrode and overlapping the storage electrode with the gate insulating layer interposed therebetween.

The storage electrode may include a first electrode line parallel to the gate line and a pair of second electrode lines intersecting the first electrode line.

The first electrode line may include a pair of first electrode lines, and the storage electrode may have an opening enclosed by the pair of first electrode lines and the pair of second electrode lines.

The drain electrode may include a contact portion contacting the pixel electrode, and the passivation layer may include a first opening exposing the contact portion and a second opening connected to the first opening and being larger than the opening of the storage electrode and smaller than a width of the pixel electrode.

An edge of the second opening may correspond to an outside edge of the second electrode line or may be positioned outside the second electrode line of the storage electrode.

The pixel electrode may overlap the first electrode line and the second electrode line with the gate insulating layer interposed therebetween.

One of the pair of second electrode lines may be integrally formed with the storage electrode of a first neighboring pixel, and the other of the pair of second electrode lines may be connected to the storage electrode of a second neighboring pixel through a connection bridge.

The drain electrode may include a contact portion contacting the pixel electrode, and the passivation layer may have a first opening exposing the contact portion and a second opening connected to the first opening and being larger than a distance between the pair of second electrode lines and smaller than a width of the pixel electrode.

An edge of the second opening may correspond to an outside edge of the second electrode line or may be positioned outside the second electrode line of the storage electrode.

The gate insulating layer may include silicon oxide, and may be formed by a chemical vapor deposition process. The gate insulating layer may have a thickness of 3500 Å to 4500 Å.

the passivation layer may include silicon nitride, and may be formed by a chemical vapor deposition process.

In another embodiment according to the present invention, a method for manufacturing a thin film transistor array panel is provided. The method includes: concurrently forming on a substrate, a gate line and a storage electrode including a first electrode line parallel to the gate line and a pair of second electrode lines intersecting the first electrode line; forming a gate insulating layer on the entire substrate; forming a data line crossing the gate line, a source electrode coupled to the data line, and a drain electrode separated from the source electrode on the gate insulating layer; forming and patterning a passivation layer on the entire substrate to form a first opening exposing a portion of the drain electrode and a second opening connected to the first opening and having a greater width than a distance between the pair of second electrode lines; and forming a pixel electrode covering the first opening and the second opening and having a greater width than the second opening.

The first electrode line may include a pair of first electrode lines, the storage electrode may include an opening enclosed by the pair of first electrode lines and the pair of second electrode lines, and the second opening may be larger than the opening of the storage electrode.

The gate insulating layer may include silicon oxide, and may have a thickness of 3500 Å to 4500 Å.

The passivation layer may include silicon nitride, and may be formed by a chemical vapor deposition process, and the first opening and the second opening may be etched by a wet etching process.

The storage capacitor of the present exemplary embodiment may increase the capacitance by the reduction of the thickness of the dielectric layer while preventing a short between the storage electrode and the pixel electrode, and may improve the aperture ratio by decreasing the width of the storage electrode. Also, the passivation layer may exist under the pixel electrode such that the transmittance of the light emitted from the backlight may be increased, thereby improving the screen luminance.

DETAILED DESCRIPTION

Figure 1:
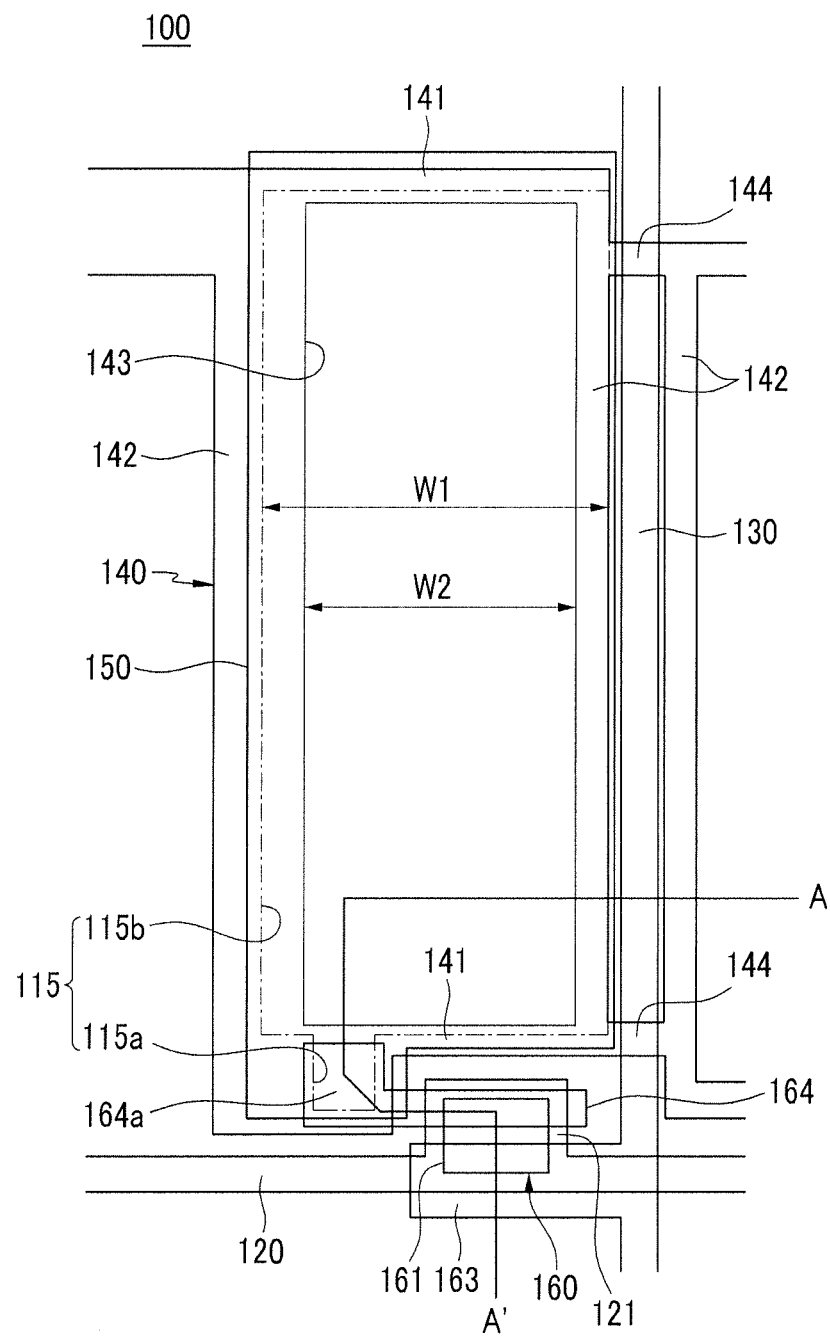
FIG. 1 is a layout view of a thin film transistor array panel according to an exemplary embodiment.

Aspects of embodiments according to the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. It will be understood that when an element such as a layer, film, region, or substrate is referred to as being "on" another element, it may be directly on the other element or intervening elements may also be present. It will be understood that when an element is referred to as being "directly on" another element, intervening elements may not be present.

Figure 2:
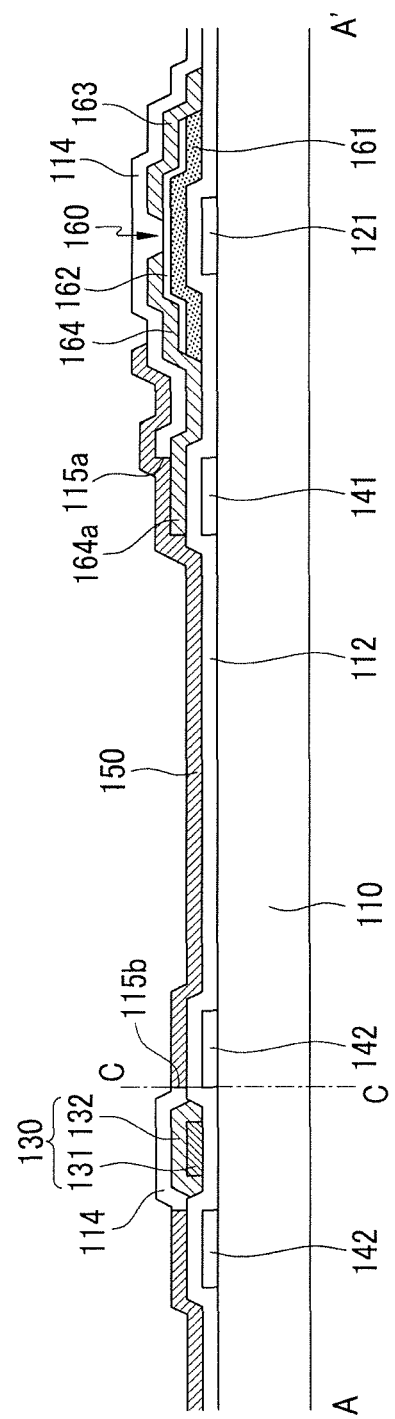
FIG. 2 is a cross-sectional view of the thin film transistor array panel of FIG. 1 taken along the line A-A'.

FIG. 1 is a layout view of a thin film transistor array panel 100 according to an exemplary embodiment, and FIG. 2 is a cross-sectional view of the thin film transistor array panel 100 of FIG. 1 taken along the line A-A'.

Referring to FIG. 1 and FIG. 2, a gate line 120, a data line 130, and a storage electrode 140 are positioned on a substrate (hereinafter, "first substrate") 110. In the described embodiment, the first substrate 110 is formed with a transparent insulating material such as glass, quartz, ceramic, or plastic.

The gate line 120 transmits a gate signal, and extends in one direction (e.g., a horizontal direction) of the first substrate 110. The gate line 120 has a gate electrode 121 protruded to one side. A gate driving circuit (not shown) that generates the gate signal may be mounted on a flexible printed circuit film (not shown) attached on the first substrate 110, mounted (e.g., directly mounted) on the first substrate 110, or integrated with the first substrate 110.

The storage electrode 140 may be formed at the same layer and with the same material as the gate line 120. The storage electrode 140 receives a common voltage, and has a first electrode line 141 in parallel to the gate line 120 and a pair of second electrode lines 142 intersecting the first electrode line 141.

In one embodiment, the storage electrode 140 may have a pair of first electrode lines 141 in parallel to the gate line 120 and a pair of second electrode lines 142 intersecting the first electrode line 141. That is, the storage electrode 140 may be formed with a rectangular frame shape having an opening 143. FIG. 1 and FIG. 2 show an example in which the storage electrode 140 is formed with a rectangular frame shape. In this case, the area of the storage electrode 140 is increased (e.g., expanded) such that the overlapping area with the pixel electrode 150 is increased such that the capacitance of a storage capacitor may be increased. The pixel electrode 150 and its overlapping with the storage electrode 140 will be explained later.

The storage electrode 140 is connected to a storage electrode 140 of a neighboring pixel such that all storage electrodes 140 commonly receive a common voltage. For this, one (the left second electrode line 142 with reference to FIG. 1) of a pair of second electrode lines 142 may be integrally formed with the second electrode line 142 of the neighboring pixel, and the other (the right second electrode line 142 with reference to FIG. 1) may be connected to the second electrode line 142 of the neighboring pixel through a connection bridge 144. The shape and arrangement of the storage electrode 140 are not limited to the described example, and may be variously changed.

The gate line 120 and the storage electrode 140 may be made of at least one metal of aluminum (Al), neodymium (Nd), silver (Ag), chromium (Cr), titanium (Ti), tantalum (Ta), and molybdenum (Mo), or alloys thereof. The gate line 120 and the storage electrode 140 may have a multi-layered structure. For example, the gate line 120 and the storage electrode 140 may include a lower layer of an aluminum (Al)-containing metal or a silver (Ag)-containing metal, and an upper layer of chromium (Cr), tantalum (Ta), titanium (Ti), or molybdenum (Mo) having excellent chemical and physical characteristics.

A gate insulating layer 112 covering the gate line 120 and the storage electrode 140 may be formed over substantially an entire area of the first substrate 110. The gate insulating layer 112 includes a silicon oxide, and may be formed through a chemical vapor deposition (CVD) process. The thickness of the gate insulating layer 112 may be in the range of 3500 Å to 4500 Å.

A lower layer 131 of the data line 130 and an activation layer 161 are positioned on the gate insulating layer 112. The lower layer 131 crosses the gate line 120, and the activation layer 161 is positioned on the gate electrode 121. The lower layer 131 and the activation layer 161 may be made of amorphous silicon that is not doped. An ohmic contact layer 162 may be positioned on the activation layer 161. The ohmic contact layer 162 may be made of amorphous silicon that is doped with an n-type impurity of a high concentration, or of silicide.

The upper layer 132 is positioned on the lower layer 131, and the lower layer 131 and an upper layer 132 form the data line 130. The data line 130 transmits the data signal, and extends in the direction crossing the gate line 120. A data driving circuit (not shown) that generates the data signal may be mounted on a flexible printed circuit film (not shown) attached on the first substrate 110, mounted (e.g., directly mounted) on the first substrate 110, or integrated with the first substrate 110.

The data line 130 may be positioned outside the second electrode line 142 of the storage electrode 140. The data line 130 has a source electrode 163 protruded to one side in the crossing region of the gate line 120 and the data line, and a data electrode 164 is positioned with an interval between it and the source electrode 163.

The source electrode 163 overlaps a portion of the gate line 120 and the activation layer 161, and the drain electrode 164 overlaps a portion of the first electrode line 141 of the storage electrode 140 and the activation layer 161. Here, the portion of the drain electrode 164 that overlaps the storage electrode 140 is not covered by a passivation layer 114 that will be described later and is exposed, thereby forming a contact portion 164a contacting the pixel electrode 150. The source electrode 163 and the drain electrode 164 are separated (e.g., by a predetermined distance) on the gate electrode 121.

One gate electrode 121, one source electrode 163, and one drain electrode 164 form a thin film transistor 160 along with the activation layer 161. The thin film transistor 160 is formed in the crossing region of the gate line 120 and the data line 130, and the channel of the thin film transistor 160 is formed in the activation layer 161 between the source electrode 163 and the drain electrode 164.

The upper layer of the data line 130, and the source electrode 163 and the drain electrode 164, may include the same material as the gate electrode 121 and the storage electrode 140, and may have a triple-layered structure including the lower layer, a middle layer, and the upper layer.

The lower layer may include a material having excellent physical and chemical characteristics such as chromium (Cr), titanium (Ti), tantalum (Ta), and molybdenum (Mo). The middle layer may include a material having low resistivity such as an aluminum (Al)-containing metal or a silver (Ag)-containing metal. The upper layer may include a material having excellent contact characteristics along with the material for the pixel electrode of ITO (indium tin oxide) or IZO (indium zinc oxide) such as a pure molybdenum (Mo) or molybdenum alloys of molybdenum nitride (MoN), molybdenum-niobium (MoNb), molybdenum-vanadium (MoV), molybdenum-titanium (MoTi) and molybdenum-tungsten (MoW).

The passivation layer 114 is formed on the data line 130 and a portion of the thin film transistor 160. The passivation layer 114 includes silicon nitride and may be formed through CVD using silane gas.

The passivation layer 114 of the present exemplary embodiment has an opening 115 that exposes a portion of the drain electrode 164 and is larger than the opening 143 of the storage electrode 140 and smaller than the pixel electrode 150, instead of a via hole exposing the portion of the drain electrode 164. In the layout view of FIG. 1, the opening 115 of the passivation layer 114 is indicated by one-point chain lines (e.g., lines including alternating dots and dashes).

That is, most of a portion of the pixel area where the light from a backlight unit is passed through the passivation layer 114 is removed by a wet etching process. Here, the pixel area may be defined as a rectangular region contacting one gate line 120 and one data line 130.

The opening 115 of the passivation layer 114 includes a first opening 115a exposing a portion (i.e., the contact portion 164a) of the drain electrode 164 overlapping the storage electrode 140, and a second opening 115b connected to the first opening 115a and having a greater width (or size) than the opening 143 of the storage electrode 140. The width w1 of the second opening 115b in the direction of the gate line 120 is greater than the width w2 of the opening 143 of the storage electrode 140 in the same direction.

For example, the edge of the second opening 115b corresponds to the outside edge of the second electrode line 142 of the storage electrode 140 or is disposed outside the outside edge of the second electrode line 142. In FIG. 2, the edge of the second opening 115b corresponds to the outside edge of the second electrode line 142, and the line crossing the edges is indicated by the line C-C in the cross-sectional view.

Accordingly, the gate insulating layer 112 and the passivation layer 114 are both deposited, but the gate insulating layer 112 is only deposited on the second electrode line 142 of the storage electrode 140. Also, the gate insulating layer 112 and the passivation layer 114 are both positioned, but the gate insulating layer 112 is only positioned between the pair of second electrode lines 142, that is, in the opening 143 of the storage electrode 140.

The portion of the drain electrode 164 exposed through the first opening 115a of the passivation layer 114 forms the contact portion 164a, and the passivation layer 114 is positioned on the drain electrode 164 except for the contact portion 164a, and on the thin film transistor 160 and the data line 130.

A pixel electrode 150 overlapping the storage electrode 140 and the contact portion 164a of the drain electrode 164 is positioned on the gate insulating layer 112. The pixel electrode 150 is formed with the transparent conductive layer such as ITO (indium tin oxide) or IZO (indium zinc oxide), wholly (e.g., entirely) covers the first opening 115a and the second opening 115b of the passivation layer 114, and has a greater width (or size) than the first and second openings 115a and 115b. A pixel electrode 150 is positioned at each pixel area.

The pixel electrode 150 sequentially contacts the gate insulating layer 112, the contact portion 164a of the drain electrode 164, and the portion of the passivation layer 114 from the left side to the right side of FIG. 2. The pixel electrode 150 overlaps the first electrode line 141 and the second electrode line 142 of the storage electrode 140, for example, the whole (e.g., entire) second electrode line 142. The pixel electrode 150 contacts the drain electrode 164, thereby being electrically connected to the drain electrode 164.

In the present exemplary embodiment, the gate insulating layer 112 is located between the storage electrode 140 and the pixel electrode 150. That is, the passivation layer 114 is not present between the storage electrode 140 and the pixel electrode 150. The storage electrode 140 and the pixel electrode 150 that have the gate insulating layer 112 interposed therebetween, form the storage capacitor.

If it is assumed that the two layers of the gate insulating layer 112 and the passivation layer 114 are positioned between the storage electrode 140 and the pixel electrode 150, the capacitance of the storage capacitor is decreased by increasing the thickness of the dielectric layer (e.g., the gate insulating layer and the passivation layer). Accordingly, the width of the storage electrode 140 should be wide to increase the capacitance of the storage capacitor, however, if the width of the storage electrode 140 is increased (e.g., in the determined pixel size) in this case, the aperture ratio is decreased such that the high transmittance characteristic may not be realized.

Also, if it is assumed that the passivation layer 114 is only formed between the storage electrode 140 and the pixel electrode 150, the thickness of the dielectric layer (e.g., the passivation layer) is decreased to about 2000 Å such that the capacitance of the storage capacitor may be increased, however a short circuit deterioration may be generated between the storage electrode 140 and the pixel electrode 150 by the characteristics of the passivation layer 114.

That is, the passivation layer 114 is deposited by using the silane gas including silicon nitride, and the passivation layer 114 has pores because of hydrogen included in the silane gas, such that a plurality of particles are inevitably generated in the CVD process. The storage electrode 140 and the pixel electrode 150 may be easily shorted by the pores of the passivation layer 114 and the particles.

In the present exemplary embodiment, the gate insulating layer 112 is formed with silicon oxide having an excellent film quality rather than by the passivation layer 114. Here, the excellent film quality means to have pores and particles that are small. Accordingly, the gate insulating layer 112 suppresses the short between the storage electrode 140 and the pixel electrode 150 such that the storage electrode 140 and the pixel electrode 150 may realize a stable storage capacitor.

Also, the storage capacitor of the present exemplary embodiment may increase the capacitance through decreasing the thickness of the dielectric layer (e.g., the gate insulating layer 112) compared with the dielectric layer of a dual-layered structure, and as a result, the aperture ratio may be increased through the reduction of the width of the storage electrode 140. Furthermore, the pixel electrode 150 overlaps the pair of first electrode lines 141 and the pair of second electrode lines 142 on the edge of the pixel area such that the overlapping area is increased while increasing the aperture ratio, and thereby increasing the capacitance of the storage capacitor.

The thickness of the gate insulating layer 112 may be in the range of 3500 Å to 4500 Å. If the thickness of the gate insulating layer 112 is less than 3500 Å, the insulating performance may be deteriorated between the storage electrode 140 and the pixel electrode 150, and if the thickness of the gate insulating layer 112 is more than 4500 Å, the capacitance of the storage capacitor may be decreased.

Also, the passivation layer 114 including the silicon nitride has low transmittance, however, the passivation layer 114 of the present exemplary embodiment has the above-described openings 115a and 115b such that the gate insulating layer 112 and the pixel electrode 150 are positioned in the opening 143 of the storage electrode 140. Accordingly, the thin film transistor array panel 100 according to the present exemplary embodiment increases the transmittance of the light emitted from the backlight unit such that the screen luminance may be improved.

Next, the manufacturing method of the above-described thin film transistor array panel will be described with reference to FIG. 3 to FIG. 10.

FIG. 3 to FIG. 10 are views showing a manufacturing method of a thin film transistor array panel according to an exemplary embodiment. FIG. 4, FIG. 6, FIG. 8, and FIG. 10 are cross-sectional views taken along the line A-A' of FIG. 3, FIG. 5, FIG. 7, and FIG. 9, respectively.

Figure 3:
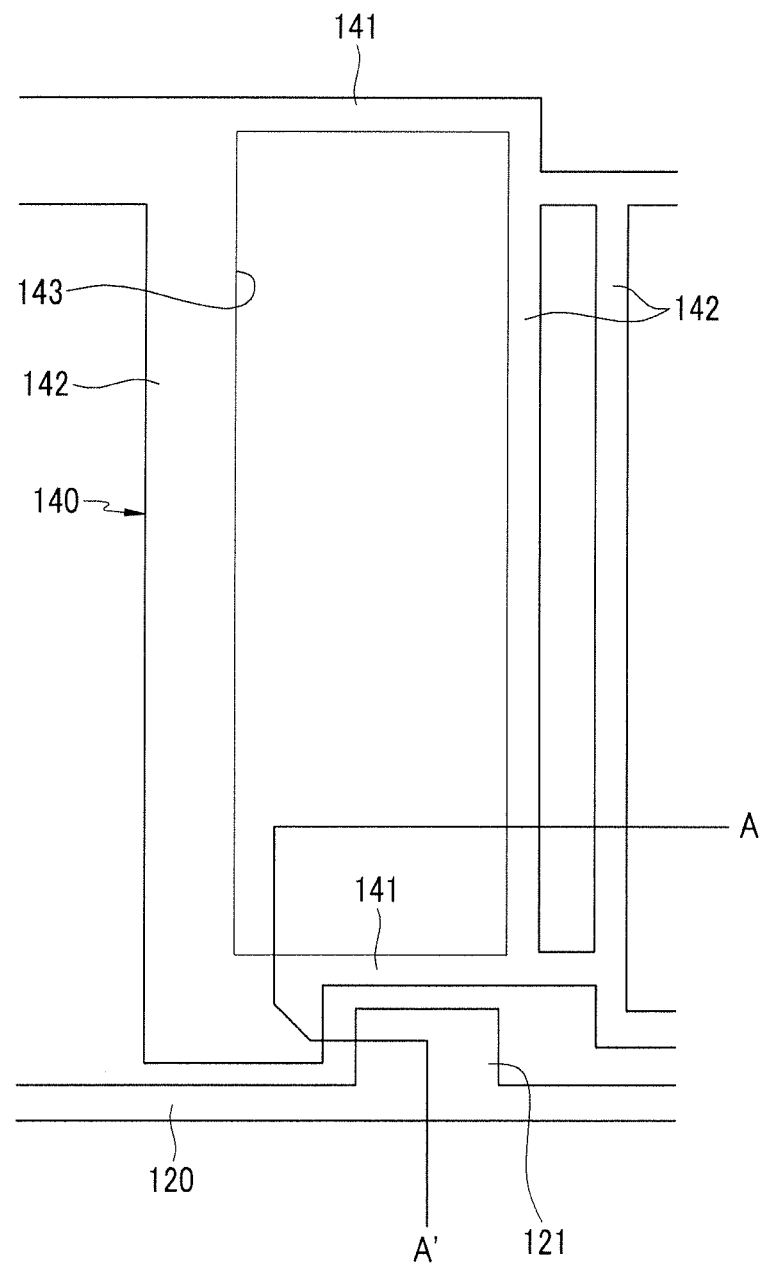
FIG. 3 to FIG. 10 are views showing a manufacturing method of a thin film transistor array panel according to an exemplary embodiment.
Figure 4:
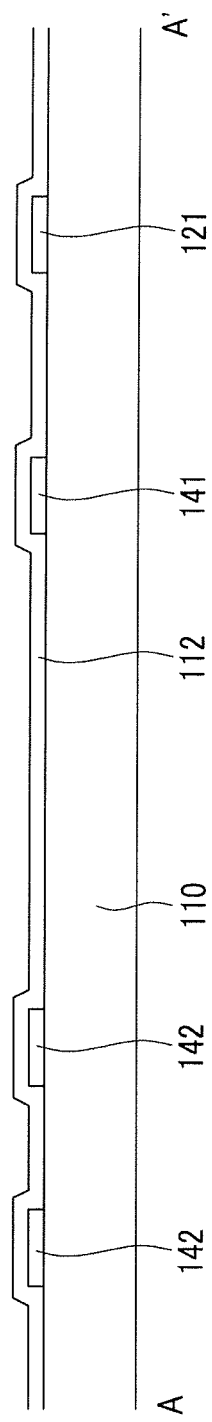

Referring to FIG. 3 and FIG. 4, the first substrate 110 made of an insulating material such as glass, quartz, ceramic, or plastic is provided, and the first conductive layer is formed on the first substrate 110 and patterned through a photolithography process. Accordingly, a gate line 120 including a gate electrode 121, and a storage electrode 140 are formed.

The first conductive layer may be made of at least one metal of aluminum (Al), neodymium (Nd), silver (Ag), chromium (Cr), titanium (Ti), tantalum (Ta), and molybdenum (Mo), or alloys thereof. Also, the first conductive layer may have a multi-layered structure. For example, the first conductive layer may have a dual-layered structure including a lower layer of an aluminum (Al)-containing metal or silver (Ag)-containing metal, and an upper layer of chromium (Cr), tantalum (Ta), titanium (Ti), or molybdenum (Mo) having excellent chemical and physical characteristics.

The gate line 120 extends in one direction (e.g., a horizontal direction) of the first substrate 110, and has a gate electrode 121 protruded to one side. The storage electrode 140 may have the first electrode line 141 parallel to the gate line 120 and a pair of second electrode lines 142 intersecting the first electrode line 141.

The storage electrode 140 crosses the center of the pixel area, is not parallel to the gate line 120, and is formed with the rectangular frame shape having an opening 143 at the center such that the storage electrode 140 expands (e.g., increases) the overlapping area along with the pixel electrode 150 (referring to FIG. 1) while increasing the aperture ratio, and thereby increasing the capacitance of the storage capacitor.

Next, a gate insulating layer 112 covering the gate line 120 and the storage electrode 140 is entirely (or substantially entirely) formed on the first substrate 110. In other words, the gate insulating layer 112 is formed on substantially an entire area of the first substrate 110. The gate insulating layer 112 includes silicon oxide, and may be formed through a chemical vapor deposition (CVD) process. The thickness of the gate insulating layer 112 may be in the range of 3500 Å to 4500 Å.

Figure 5:
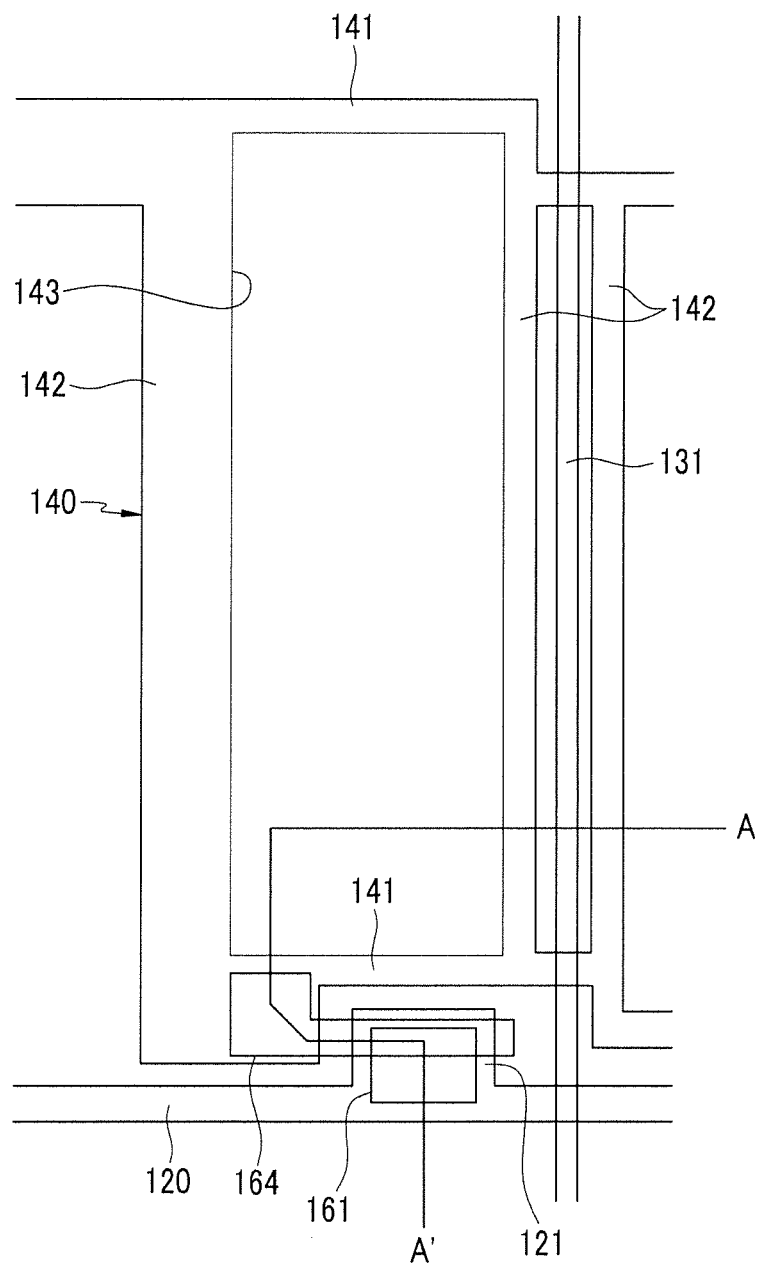
Figure 6:
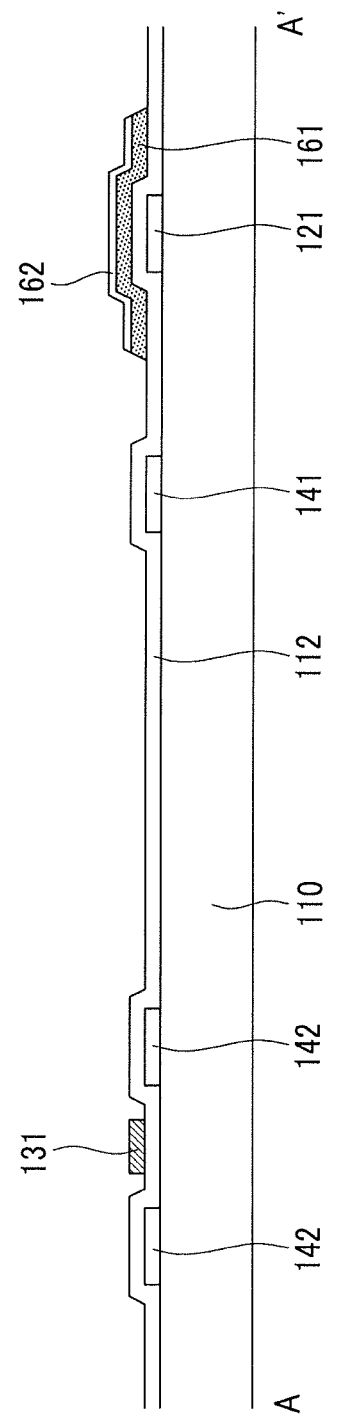

Referring to FIG. 5 and FIG. 6, the first semiconductor layer is formed on the gate insulating layer 112 and is patterned through the photolithography process to form an activation layer 161, and a lower layer 131 of the data line. The first semiconductor layer may be formed by the deposition process, and may include the non-doped amorphous silicon. The activation layer 161 is positioned on the gate electrode 121.

Next, the second semiconductor layer covering the activation layer 161 and the lower layer 131 is entirely (e.g., substantially entirely) formed on the gate insulating layer 112 (e.g., is formed on substantially an entire area of the gate insulating layer 112), and is patterned through the photolithography process to form an ohmic contact layer 162. The second semiconductor layer may be formed through the deposition process, and may be made of amorphous silicon that is doped with an n-type impurity such as phosphorus of a high concentration, or of silicide. The ohmic contact layer 162 is contacted with the activation layer 161 and is positioned on the activation layer 161.

Figure 7:
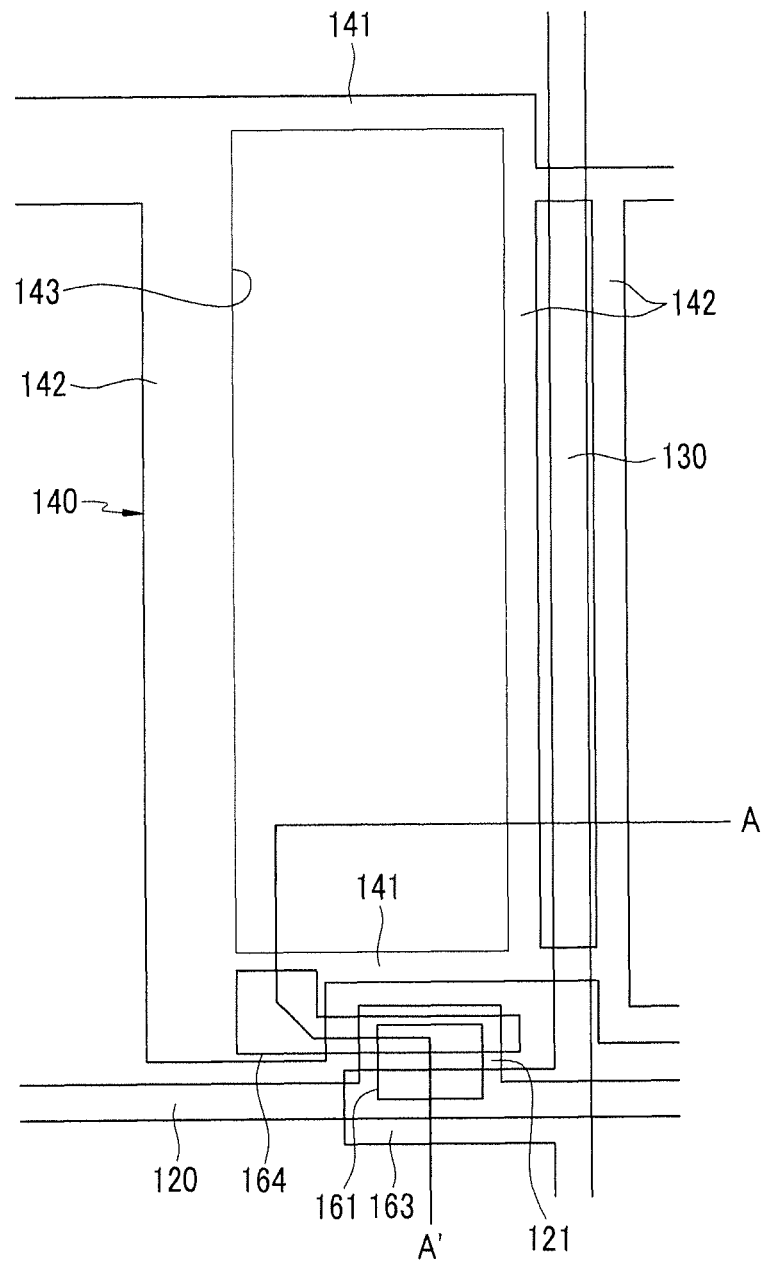
Figure 8:
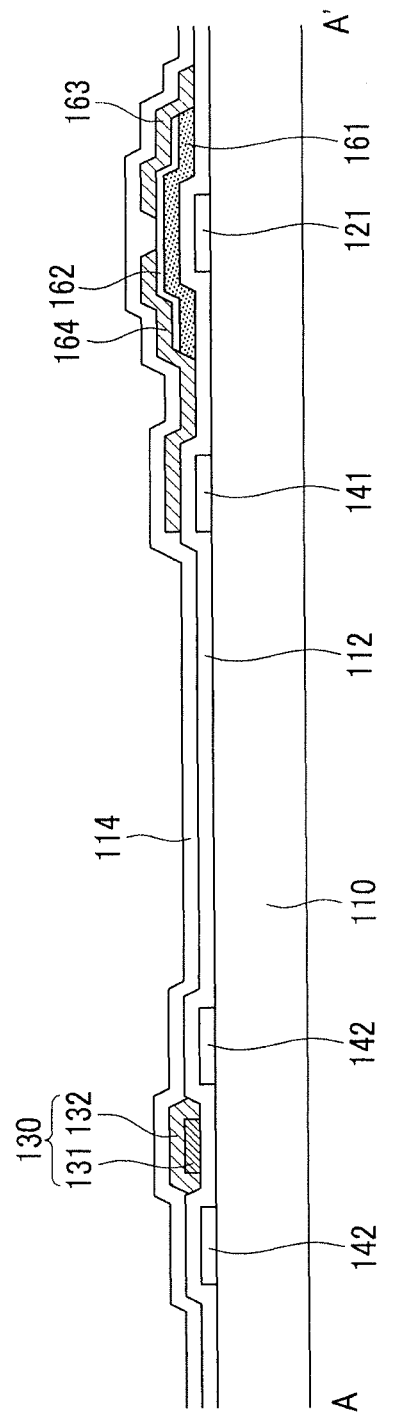

Referring to FIG. 7 and FIG. 8, the second conductive layer covering the ohmic contact layer 162 and the lower layer 131 of the data line 130 is entirely (e.g., substantially entirely) formed on the gate insulating layer 112 (e.g., formed over substantially entire gate insulating layer 112), and is patterned through the photolithography process to concurrently (e.g., simultaneously) form a source electrode 163, a drain electrode 164, and an upper layer 132 of the data line 130. The second conductive layer may include the same material as the first conductive layer, and may have a triple-layered structure including the lower layer, the middle layer, and the upper layer.

The lower layer may include the material having excellent physical and chemical characteristics such as chromium (Cr), titanium (Ti), tantalum (Ta), and molybdenum (Mo). The middle layer may include the material having low resistivity such as the aluminum (Al)-containing metal or silver (Ag)-containing metal. The upper layer may include the material having excellent contact characteristics along with the material for the pixel electrode of ITO (indium tin oxide) or IZO (indium zinc oxide) such as pure molybdenum (Mo) or molybdenum alloys of molybdenum nitride (MoN), molybdenum-niobium (MoNb), molybdenum-vanadium (MoV), molybdenum-titanium (MoTi), and molybdenum-tungsten (MoW).

The data line 130 includes the lower layer 131 and the upper layer 132 and transmits the data signal, extends in the direction crossing the gate line 120, and may be positioned outside the second electrode line 142 of the storage electrode 140. The upper layer 132 of the data line 130 and the source electrode 163 are integrally formed, and the drain electrode 164 is separated from the source electrode 163 (e.g., by a predetermined distance).

Next, a passivation layer 114 covering the data line 130, the source electrode 163, and the drain electrode 164 is formed on the gate insulating layer 112. The passivation layer 114 includes silicon nitride and may be formed through the CVD process using silane gas.

Figure 9:
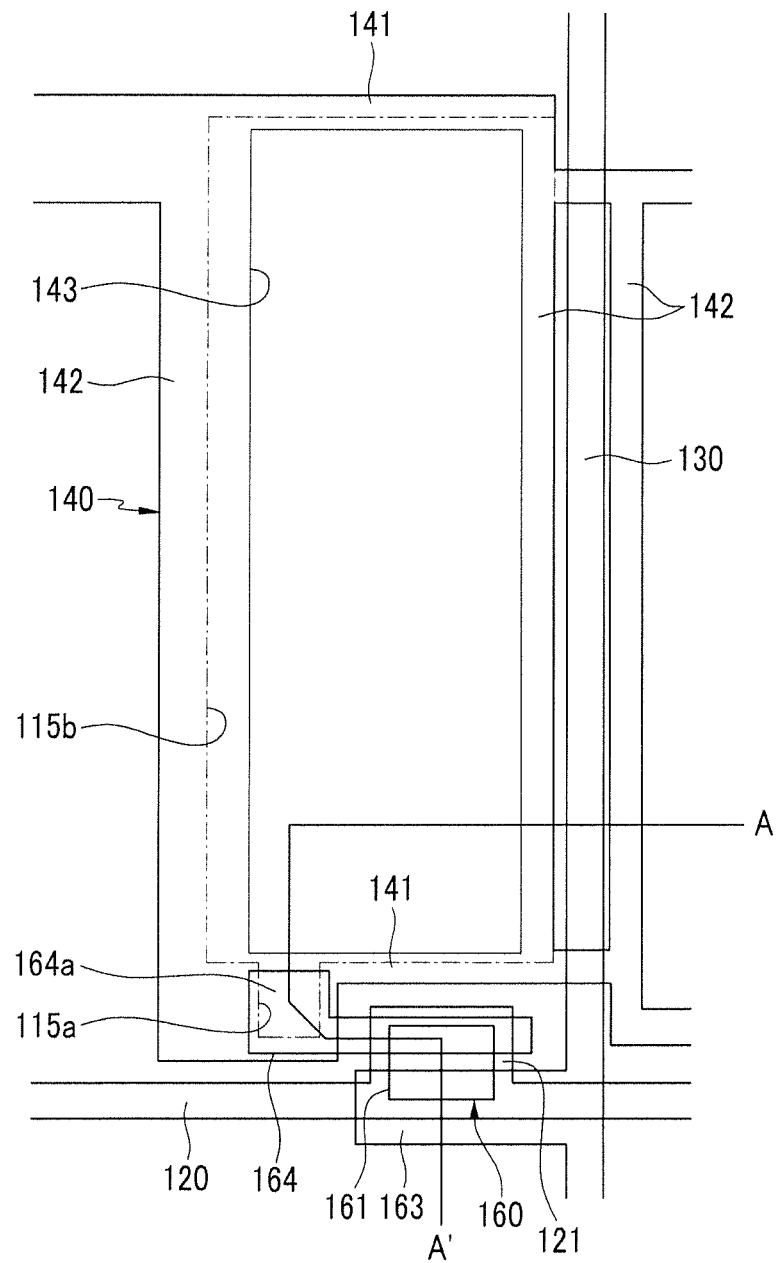
Figure 10:
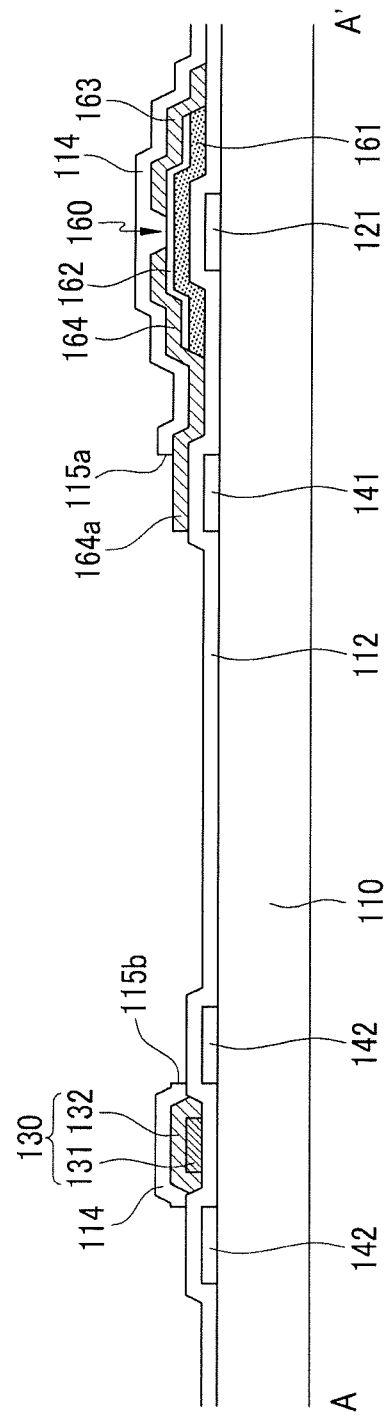

Referring to FIG. 9 and FIG. 10, the passivation layer 114 is patterned through the photolithography process to form openings 115a and 115b in the passivation layer 114. In one embodiment, the etching is wet etching. The openings 115a and 115b of the passivation layer 114 include the first opening 115a exposing the portion of the drain electrode 164 overlapping the storage electrode 140 and the second opening 115b connected to the first opening 115a and having a greater width (or size) than the opening 143 of the storage electrode 140.

Again referring to FIG. 1 and FIG. 2, a transparent conductive layer such as ITO or IZO is formed on the above-described structure and is patterned through the photolithography process to form a pixel electrode 150. The pixel electrode 150 covers the first opening 115a and the second opening 115b of the passivation layer 114, and has a greater width (or size) than the first and second openings 115a and 115b. A pixel electrode 150 is positioned for each pixel area, and the thin film transistor array panel 100 is completed.

Figure 11:
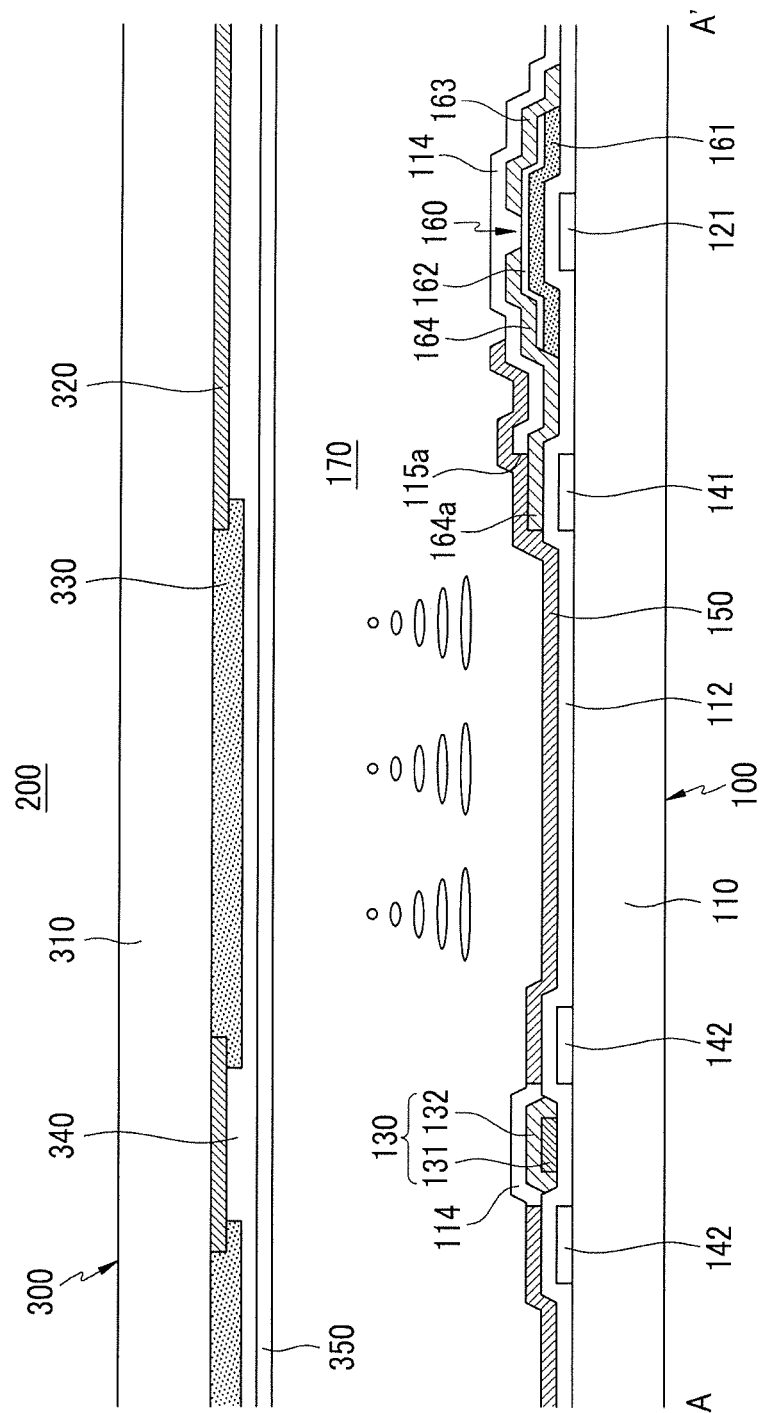
FIG. 11 is a partial cross-sectional view of a liquid crystal display (LCD) according to an exemplary embodiment.

FIG. 11 is a partial cross-sectional view of a liquid crystal display (LCD) including the thin film transistor array panel of FIG. 1 and FIG. 2.

Referring to FIG. 1 and FIG. 11, the liquid crystal display (LCD) 200 includes a thin film transistor array panel 100, a color filter panel 300, and a liquid crystal layer 170. The color filter panel 300 includes a transparent substrate (hereinafter, "second substrate") 310, a black matrix 320, a color filter 330, an overcoat 340, and a common electrode 350. The liquid crystal layer 170 is located between the thin film transistor array panel 100 and the color filter panel 300.

The black matrix 320 is positioned on one surface of the second substrate 310 toward the liquid crystal layer 170, and has an opening corresponding to the pixel electrode 150. The black matrix 320 prevents or reduces light leakage outside the pixel area and light interference between the pixels. The color filter 330 includes a red filter, a green filter, and a blue filter that are alternately and repeatedly located with the black matrix 320 as the boundary. The color filter 330 provides color to the light that is irradiated from the backlight unit and is passed through the liquid crystal layer 170.

The overcoat 340 is formed on the black matrix 320 and the color filter 330, and protects the color filter 330. The common electrode 350 is positioned on the overcoat 340, and is made of the transparent conductive layer including ITO or IZO.

The thin film transistor 160 has a switch function for transmitting or blocking a video signal (data signal) transmitted through the data line 130 according to the scan signal transmitted through the gate line 120, to the pixel electrode 150. The common electrode 350 receives the common voltage, and applies the voltage to the liquid crystal layer 170 along with the pixel electrode 150 to change the light transmittance for each pixel.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

| Description of Some of the Reference Numerals | |
|---|---|
| 100: thin film transistor array panel | 110: first substrate |
| 112: gate insulating layer | 114: passivation layer |
| 120: gate line | 121: gate electrode |
| 130: data line | 140: storage electrode |
| 150: pixel electrode | 161: activation layer |
| 162: ohmic contact layer | 163: source electrode |
| 164: drain electrode | 164a: contact portion |
| 170: liquid crystal layer | 200: liquid crystal display (LCD) |
| 300: color filter panel | 310: the second substrate |
| 320: black matrix | 330: color filter |

What is claimed is:

1. A thin film transistor array panel comprising:
a gate line and a storage electrode on a substrate and separated from each other;
a gate insulating layer covering the gate line and the storage electrode;
a data line crossing the gate line and being on the gate insulating layer;
a thin film transistor at a crossing region of the gate line and the data line, and including a gate electrode, a source electrode, and a drain electrode;
a passivation layer exposing a portion of the drain electrode and formed on the thin film transistor and the data line; and
a pixel electrode contacting the drain electrode and overlapping the storage electrode with the gate insulating layer interposed therebetween.

2. The thin film transistor array panel of claim 1, wherein the storage electrode comprises a first electrode line parallel to the gate line and a pair of second electrode lines intersecting the first electrode line.

3. The thin film transistor array panel of claim 2, wherein the first electrode line comprises a pair of first electrode lines, and the storage electrode has an opening enclosed by the pair of first electrode lines and the pair of second electrode lines.

4. The thin film transistor array panel of claim 3, wherein the drain electrode comprises a contact portion contacting the pixel electrode, and
the passivation layer comprises a first opening exposing the contact portion and a second opening connected to the first opening and being larger than the opening of the storage electrode and smaller than a width of the pixel electrode.

5. The thin film transistor array panel of claim 4, wherein an edge of the second opening corresponds to an outside edge of the second electrode line or is positioned outside the second electrode line of the storage electrode.

6. The thin film transistor array panel of claim 4, wherein the pixel electrode overlaps the first electrode line and the second electrode line with the gate insulating layer interposed therebetween.

7. The thin film transistor array panel of claim 2, wherein one of the pair of second electrode lines is integrally formed with the storage electrode of a first neighboring pixel, and the other of the pair of second electrode lines is connected to the storage electrode of a second neighboring pixel through a connection bridge.

8. The thin film transistor array panel of claim 2, wherein the drain electrode comprises a contact portion contacting the pixel electrode, and the passivation layer has a first opening exposing the contact portion and a second opening connected to the first opening and being larger than a distance between the pair of second electrode lines and smaller than a width of the pixel electrode.

9. The thin film transistor array panel of claim 8, wherein an edge of the second opening corresponds to an outside edge of the second electrode line or is positioned outside the second electrode line of the storage electrode.

10. The thin film transistor array panel of claim 1, wherein the gate insulating layer comprises silicon oxide, and is formed by a chemical vapor deposition process.

11. The thin film transistor array panel of claim 10, wherein the gate insulating layer has a thickness of 3500 Å to 4500 Å.

12. The thin film transistor array panel of claim 1, wherein the passivation layer comprises silicon nitride, and is formed by a chemical vapor deposition process.

* * * * *